US009818890B2

(12) United States Patent
Khatri et al.

(10) Patent No.: US 9,818,890 B2
(45) Date of Patent: Nov. 14, 2017

(54) SOLAR CELL CONTACTS WITH NICKEL INTERMETALLIC COMPOSITIONS

(71) Applicant: Heraeus Precious Metals North America Conshohocken LLC, West Conshohocken, PA (US)

(72) Inventors: Himal Khatri, San Diego, CA (US); Aziz S. Shaikh, San Diego, CA (US); Srinivasan Sridharan, Strongsville, OH (US); Klaus Kunze, Carlsbad, CA (US)

(73) Assignee: Ferro Corporation, Mayfield Heights, OH (US)

( * ) Notice: Subject to any disclaimer, the term of this patent is extended or adjusted under 35 U.S.C. 154(b) by 149 days.

(21) Appl. No.: 14/394,908

(22) PCT Filed: Apr. 18, 2013

(86) PCT No.: PCT/US2013/037137
§ 371 (c)(1),
(2) Date: Oct. 16, 2014

(87) PCT Pub. No.: WO2013/158857
PCT Pub. Date: Oct. 24, 2013

(65) Prior Publication Data
US 2015/0122323 A1 May 7, 2015

Related U.S. Application Data

(60) Provisional application No. 61/635,255, filed on Apr. 18, 2012.

(51) Int. Cl.
*H01L 31/0224* (2006.01)
*H01L 31/0216* (2014.01)
*H01B 1/22* (2006.01)

(52) U.S. Cl.
CPC ....... *H01L 31/022425* (2013.01); *H01B 1/22* (2013.01); *H01L 31/02168* (2013.01); *H01L 31/02245* (2013.01); *Y02E 10/50* (2013.01)

(58) Field of Classification Search
CPC ........................................................ H01B 1/02
See application file for complete search history.

(56) References Cited

U.S. PATENT DOCUMENTS 4,342,795 A 8/1982 Marcus et al.
6,303,015 B1 10/2001 Thorpe et al.
(Continued)

FOREIGN PATENT DOCUMENTS

CN 101506992 A 8/2009
CN 101663711 A 3/2010
(Continued)

OTHER PUBLICATIONS

International Search Report issued in PCT/US2013/037137 dated Aug. 26, 2013.
(Continued)

*Primary Examiner* — William Young
(74) *Attorney, Agent, or Firm* — Blank Rome LLP; Charles R. Wolfe, Jr.; Francine F. Li

(57) ABSTRACT

Paste compositions, methods of making a paste composition, and methods of making a solar cell contact are disclosed. The paste composition can contain a nickel intermetallic compound such as nickel silicide, nickely boride or nickel phosphide, a glass frit, a metal additive and an organic vehicle system. The paste can be used for making a solar cell contact.

11 Claims, 1 Drawing Sheet

(56) References Cited

U.S. PATENT DOCUMENTS

| | | | |
|---|---|---|---|
| 8,319,096 B2 | 11/2012 | Ishikawa et al. | |
| 2003/0060353 A1* | 3/2003 | Miki | C03C 8/18 |
| | | | 501/19 |
| 2004/0046154 A1 | 3/2004 | McVicker et al. | |
| 2008/0121276 A1 | 5/2008 | Lopatin et al. | |
| 2009/0056798 A1 | 3/2009 | Merchant et al. | |
| 2009/0101190 A1* | 4/2009 | Salami | C03C 3/062 |
| | | | 136/244 |
| 2009/0104457 A1 | 4/2009 | Carroll et al. | |
| 2009/0194151 A1 | 8/2009 | Ishikawa et al. | |
| 2010/0096598 A1 | 4/2010 | Sridharan et al. | |
| 2010/0154875 A1 | 6/2010 | Borland et al. | |
| 2010/0163101 A1* | 7/2010 | Kumar | H01B 1/22 |
| | | | 136/256 |
| 2011/0059230 A1* | 3/2011 | Hoerteis | C09D 11/34 |
| | | | 427/74 |
| 2012/0085401 A1* | 4/2012 | Borland | H01L 31/02168 |
| | | | 136/256 |

FOREIGN PATENT DOCUMENTS

| | | |
|---|---|---|
| JP | S60261108 A | 12/1985 |
| KR | 20100015801 A | 2/2010 |
| KR | 20110101218 A | 9/2011 |

OTHER PUBLICATIONS

Supplemental European Search Report issued in European Application No. 13778458.3 dated Oct. 29, 2015.

\* cited by examiner

SOLAR CELL CONTACTS WITH NICKEL INTERMETALLIC COMPOSITIONS

RELATED APPLICATION

This is a U.S. national phase of International Patent Application No. PCT/US2013/037137, filed Apr. 18, 2013, which claims priority to U.S. Provisional Application No. 61/635,255, filed on Apr. 18, 2012, the disclosure of which is incorporated by reference in its entirety.

TECHNICAL FIELD

The subject disclosure generally relates to a paste composition, a method of making a paste composition, a method of making a solar cell contact, and a fired contact that can be used in solar cells as well as other related components. The paste includes a nickel intermetallic composition.

BACKGROUND

Solar cells are generally made of semiconductor materials, such as silicon (Si), which convert sunlight into useful electrical energy. Solar cells are typically made of thin wafers of Si in which the required PN junction is formed by diffusing phosphorus (P) or Boron (B) from a suitable phosphorus or Boron source into a P-type or N-type Si wafer. The side of silicon wafer on which sunlight is incident is in general coated with an anti-reflective coating (ARC) to prevent reflective loss of incoming sunlight, and also it acts as passivation layer to prevent the recombination of photo-generated carriers thus to increase the efficiency of the solar cell. A two dimensional electrode grid pattern known as a front contact makes a connection to the N-side or P-side of P-type Si or N-type Si, and a coating of aluminum (Al) or Silver (Ag) on the other side (back contact) makes connection to the P-side or N-Side of the silicon. These contacts are the electrical outlets from the PN junction to the outside load.

Front contacts of silicon solar cells are formed by screen-printing a thick film paste. Typically, the paste contains appropriately fine silver particles, glass and organics. After screen-printing, the wafer and paste are fired in air, typically at furnace set temperatures of 650-1000° C. During the firing, glass softens, melts, and reacts with the anti-reflective coating, etches the silicon surface, and facilitates the formation of intimate silicon-silver contact. Silver deposits on silicon as islands. The shape, size, and number of silicon-silver islands determine the efficiency of electron transfer from silicon to the outside circuit.

SUMMARY OF THE INVENTION

The invention is generally directed to silicon solar cells and contacts thereof which include nickel intermetallic compounds in at least one part of a contact.

In particular, an embodiment of the invention is a solar cell contact comprising a fired combination including, prior to firing: (a) a crystalline silicon wafer forming a first layer of the contact; (b) an antireflective layer deposited on the silicon wafer forming a second layer of the contact, and (c) a paste comprising a nickel intermetallic compound deposited on at least a portion of the antireflective layer forming a third layer of the contact.

Another embodiment of the invention is a solar cell contact comprising a fired combination including, prior to firing: (a) a p-type silicon wafer forming a first layer of the contact, the silicon wafer having an n+ layer disposed on a light-receiving side of the wafer; (b) an antireflective layer on the n+ side of the silicon wafer forming a second layer of the contact, and (c) a paste comprising a nickel intermetallic compound disposed on the silicon wafer, forming a third layer of the contact.

A solar cell contact comprising a fired combination including, prior to firing: (a) a n-type silicon wafer forming a first layer of the contact, the silicon wafer having a p+ layer disposed on a light-receiving side of the wafer; (b) an antireflective layer on the p+ side of the silicon wafer forming a second layer of the contact, and (c) a paste comprising a nickel intermetallic compound disposed on the silicon wafer, forming a third layer of the contact.

Still another embodiment of the invention is a method of making a solar cell having an N-type wafer comprising: (a) providing a silicon wafer having an n+-side and a p+-side, (b) texturing at least a portion of the p+-side of the wafer to form a textured side, (c) depositing a passivation coating on both sides of the wafer, (d) depositing a paste including a nickel intermetallic compound onto the side opposite the textured side; i.e., n+-side, (e) depositing a paste comprising a nickel intermetallic compound on at least a portion of the textured side of the wafer, and (f) firing the wafer to sinter the paste metals such that the nickel intermetallic paste fires through the respective passivation layers to make contact to silicon.

An embodiment of the invention is a method of producing a metal-wrap through (MWT) solar cell contact comprising: (a) providing a p-type silicon wafer having two major surfaces, (b) forming a n+ layer on a light-receiving side of the wafer, (c) applying to at least one of the two major surfaces a passivation layer, (d) forming a plurality of holes in the wafer, each hole connecting the two major surfaces, (e) applying a plug paste and back contact paste comprising a nickel intermetallic compound to at least a portion of the plurality of holes, (f) forming a back contact and back surface field by applying to at least a portion of the second major surface an aluminum paste, and (g) applying to at least a portion of the front passivation layer a Ni intermetallic paste (h) firing the wafer for a time and temperature sufficient to sinter the metals in the respective pastes and form front and back contacts to silicon.

An embodiment of the invention is a method of producing a metal-wrap through (MWT) solar cell contact comprising: (a) providing a n-type silicon wafer having two major surfaces, (b) forming a p+ layer on a light receiving side of the wafer, (c) applying to at least one of the two major surfaces of the wafer a passivation layer, (d) forming a plurality of holes in the wafer, each hole connecting the two major surfaces, (e) applying an emitter paste comprising a nickel intermetallic compound to at least a portion of the two major surfaces, (f) forming a back contact and back surface field by applying to at least a portion of the second major surface an aluminum paste, and (f) firing the wafer for a time and temperature sufficient to sinter the metals in the respective pastes and form front and back contacts to silicon.

Still another embodiment of the invention is a method of producing an emitter-wrapthrough (EWT) solar cell comprising: (a) providing a p-type silicon wafer forming a first layer of the contact, (b) forming a plurality of holes in the wafer, (c) forming an n+-layer disposed onto a light-receiving side and along the holes of the wafer forming a second layer of the contact, (d) texturing at least a portion of the light-receiving n+-side of the wafer to form a textured side (e) depositing a passivation coating on both sides of the wafer, (f) applying a plug paste comprising a nickel intermetallic compound to at least a portion of the plurality of holes, (g) forming a back contact and back surface field by applying to at least a portion of the second major surface an aluminum paste separated from the plug paste by a diffusion barrier layer, and (h) firing the wafer for a time and temperature sufficient to sinter the metals in the respective pastes and form front and back contacts to silicon.

A method of making a passivated emitter and rear cell (PERC) comprising: (a) providing a silicon wafer having an n+-side, (b) texturing at least a portion of the n+-side of the wafer to form a textured side, (c) depositing a passivation coating on both sides of the wafer, (d) depositing a paste comprising a nickel intermetallic compound on at least a portion of the textured side of the wafer, (e) depositing an aluminum paste onto the side opposite the textured side, and (f) firing the wafer to sinter the paste metals such that the nickel intermetallic compound paste fires through the respective passivation layers to make contact to silicon.

In accordance with yet another embodiment of the invention, a paste composition is provided. More particularly, the paste composition includes a nickel intermetallic compound selected from the group consisting of nickel boride, nickel silicide and nickel phosphide. Combinations of the foregoing are envisioned. The paste may also include any of an organic vehicle, a solvent, a glass frit, and a metal additive.

A high-conductivity paste may be used in conjunction with the nickel intermetallic paste. The high-conductivity paste may be selected from the group consisting of silver, silver-coated nickel, and silver-coated copper.

An embodiment of the invention is a method of making a paste composition. The method involves combining nickel intermetallic and an optional glass frit (solid ingredients), together with an organic vehicle and optional solvent, and dispersing the nickel intermetallic compound and optional glass frit, in the organic vehicle and optional solvent.

In accordance with yet another aspect, a method of making a solar cell contact is provided. More particularly, in accordance with this aspect, the method involves applying a paste to a silicon substrate, the paste containing nickel intermetallic particles and a glass frit. The method further involves heating the paste to sinter the silver particles and fuse the glass frit.

The foregoing and other features of the invention are hereinafter more fully described and particularly pointed out in the claims, the following description setting forth in detail certain illustrative embodiments of the invention, these being indicative, however, of but a few of the various ways in which the principles of the invention may be employed.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE INVENTION

Figure 1A:
FIGS. 1A-1E illustrate a process flow diagram schematically illustrating a process of making a contact in a solar cell in accordance with an embodiment of the invention. Reference numerals shown in FIGS. 1A-1E depict the following:
10: p-type silicon substrate;
20: n-type diffusion layer;
30: front side passivation layer/anti-reflective coating;
40: p+ layer (back surface field (BSF));
70: first paste formed on backside;
71: back electrode formed by firing first paste 70;
80: second paste formed on backside;
81: back electrode formed by firing second paste 80;
500: front side silver/metal additive; and
501: silver/metal additive front electrode after firing paste 500 through ARC.

One of the potential methods to attain cost-effective photovoltaic products that reach the grid parity for photovoltaic energy conversion is to utilize reliable, highly efficient and cost-effective solar cells. The technology determining the PV market today with market share of about 80% is double side-contacted c-Si solar cells, which have proven to be robust and versatile. It is estimated that about 40% of the total of such solar cell processing cost is due to the use of expensive contact pastes, particularly silver-containing pastes. The inventors have discovered that an alternative to reducing silver content while maintaining the performance of a silver solar cell is to design cells using certain base metals, while maintaining low contact resistance similar to silver pastes.

Loss or degradation of electrical properties in c-Si solar cells having silver electrodes is primarily due to high ohmic loss, that is, high contact resistance between silver and the silicon substrate. Significant efforts have been made on improving contact resistance such as by changing or modifying glass frit compositions, metal powder morphologies and co-firing set profiles however with a certain level of success, for example; formation of thick insulating layers is a limiting factor at the front electrode of conventional cells.

Considerable efforts have been made to develop base metal contacts but with limited success as they required the great practical inconvenience and expense of firing in a non-oxidizing atmosphere (nitrogen, argon, nitrogen/hydrogen, etc.). There is a distinct commercial need for less expensive conductor compositions which can be fired in air to produce low contact resistance with Si surface, including conventional pattern as well as new cell architectures. Therefore, through diligent studies, the inventors have developed new conductor pastes providing low ohmic loss using base metal materials compatible to industrial-level production processes; for example fast air firing, for the cost effective solar devices.

The inventors herein have discovered that air fired base metal paste compositions comprising NiB, NiSi, NiP or their mixtures together with silver produce results equal to or superior than standard silver pastes. Such nickel intermetallic pastes have been developed and tested for contact resistance on silicon using Transmission Line Method (TLM).

Specifically, NiB was reduced to powder having an average particle size of 2-5 microns. Paste (including organic vehicle and solvent) was made based on 70-95% solids without the use of glass frit. The resultant layer sintered well.

This paste composition can be used on n$^+$-surface Si wafer comprising: (a) P-type wafer cell: Front electrode; (b) N-type wafer cells: Back electrode; (c) P-type MWT: Front/Back electrode and plug electrode; (d) N-type: Front electrode (e) EWT: plugs electrode or (e) p-PERC: Front electrodes.

The procedure for applying the paste on such substrates is selected from the group consisting of screen printing, ink jet printing, pad printing, stencil printing, hotmelt ink printing (using a hot melt paste) and microspray. At present the preferred method is screen printing.

Although the nickel intermetallic paste of the invention can be used as the front contact pastes for the fingers as described hereinabove, it is envisioned that at least one additional layer can be applied on the top of the first nickel intermetallic layer. The top layer paste composition comprises Ag, Ag coated Ni, or their combinations. The glass composition of the top layer should be compatible with that of the bottom layer to ensure good adhesion, and high bulk conductivity.

According to one embodiment, co-firings of the paste composition can be done in the range of 600° C.-800° C. peak firing temperatures at 200 inch per minute (ipm) belt speed (BS) in a typical solar furnace profile.

Contact resistivity of the paste composition of the n-surface has been confirmed using Transmission Line Measurement (TLM). Contact resistivity of NiB/n-Si is reported at two temperatures, while it is reported at one temperature for Ag/n-Si wafers, in Table 1 below.

TABLE 1

Resistivity values of various paste compositions on silicon substrate.

| | Re (mΩ-m2)@550 C. | Re (mΩ-m2)@650 C. | Re (mΩ-m2)@800 C. |
|---|---|---|---|
| NiB/n-Si | 7.11 | 1.73 | |
| Ag/n-Si | | | ~2.5 |

The subject paste composition can include a nickel intermetallic compound, glass frit, and a metal additive. A high-conductivity layer including silver, silver-coated nickel and silver coated copper is optional. By way of illustration, the paste composition can contain 78-82 wt % of the nickel intermetallic compound and further comprises 3-6 wt % of an organic vehicle, 2-4 wt % of at least one solvent, and 2-6 wt % of glass.

The paste compositions can be used as film pastes to make, for example, front contacts for silicon-based solar cells which collect current generated by exposure to light, or to make back contacts that conduct electrons to an outside load. Cell electrical performance as measured by cell efficiency ($\eta$) and fill factor (FF) is affected by the microstructure and the electrical properties of the silver/silicon interface. The electrical properties of the solar cell are also characterized by series resistance ($R_s$) and shunt resistance ($R_{Sh}$). The composition and microstructure of the front contact interface largely determine $R_s$. The subject paste compositions can provide low series resistance ($R_s$) and high shunt resistance ($R_{sh}$) to give high performance solar cells, as measured by efficiency ($\eta$) and fill factor (FF).

The paste compositions and methods of the invention can facilitate optimized interaction, bonding, and contact formation between front contact components, typically Ni and Si, through the glass medium. The paste composition can be printed on a silicon substrate, and fired to fuse the glass and sinter the metal therein. Upon firing, Ni/Si conductive islands are formed providing conductive bridges between bulk paste and silicon wafer. When leaded glasses are used, the leaded glasses allow low firing temperatures owing to their excellent flow characteristics relatively at low temperatures.

The paste can be applied on a substrate by any suitable technique. In one embodiment, the paste is applied by screen-printing, stencil printing, extrusion, pad printing, inkjet printing, hot melt printing, or any suitable microdeposition direct writing techniques that one of ordinary skill in the art would recognize. The paste composition can be used to from contacts of a solar cell. The pastes are screen-printed on a substrate and the pastes formed on the substrate are fired to relatively low temperatures (550° C. to 850° C. wafer temperature; furnace set temperatures of 650° C. to 1000° C.) to form a low resistance contact between, for example, the N-side of a phosphorus doped silicon wafer and the paste composition.

Intermetallic Component.

The paste composition can contain any suitable nickel intermetallic compound in any suitable form. The source of the nickel intermetallic compound can be individual metal powders or particles or sintered blends of such metals, later finely divided, or alloys of nickel with the other metal. While nickel silicide, nickel boride and nickel phosphide are the primary nickel intermetallics, others are possible, such as nickel aluminide, nickel-tin, nickel-indium, nickel-titanium, and nickel-chromium. The nickel intermetallic compound may be formed in situ by deposition of an organonickel compound and at least one of an organoboron compound, an organosilicon compound and an organophosphorus compound. Other metals may be useful in a nickel intermetallic compound such as vanadium, antimony, and yttrium.

The organometallic compounds useful herein in addition to the foregoing include organovanadium compounds, organoantimony compounds, and organo-yttrium compounds. The organometallic compound is a compound where metal is bound to an organic moiety. For example, the organometallic compound is an organic compound containing metal, carbon, and/or nitrogen in the molecule. Further, in addition to the foregoing metal compounds, a second metal additive selected from the group consisting of an organocobalt compound, an organotin compound, an organozirconium compound, an organozinc compound and an organolithium compound may be included in the paste compostion to form a nickel intermetallic compound in situ.

The organometallic compound can include any suitable organic moieties such as those that are $C_1$-$C_{50}$ linear or branched, saturated or unsaturated, aliphatic, alicyclic, aromatic, araliphatic, halogenated or otherwise substituted, optionally having one or more heteroatoms such as O, N, S, or Si, and/or including hydrocarbon moieties such as alkyl, alkyloxy, alkylthio, or alkylsilyl moieties.

Specific examples of organometallic compounds include metal alkoxides. The metal can be boron, silicon, vanadium, antimony, phosphorous, yttrium, or combinations thereof. It is understood that some authorities consider boron and silicon be metalloids, while phosphorus is a non-metal. For the purposes of this document, and without any intention to attribute foreign properties to them, the term "organometallic" may at times be used to include organoboron compounds, organosilicon compounds and organophosphorus compounds. The alkoxide moiety can have a branched or unbranched alkyl group of, for example, 1 to 20 carbon atoms. The respective alkoxides envisioned herein include, nickel alkoxides, boron alkoxides, phosphorus alkoxides, silicon alkoxides, vanadium alkoxides, vanadyl alkoxides, antimony alkoxides, yttrium alkoxidesm, cobaltic alkoxides, cobaltous alkoxides, stannic alkoxides, stannous alkoxides, zirconium alkoxides, zinc alkoxides and lithium alkoxides.

Examples of boron alkoxides include boron methoxide, boron ethoxide, boron propoxide, and boron butoxide. Analogous examples can be envisioned for nickel alkoxides, phosphorus alkoxides, antimony alkoxides, yttrium alkoxides, cobaltic alkoxides, cobaltous alkoxides, nickel alkoxides, zirconium alkoxides, tin alkoxides, zinc alkoxides and lithium alkoxides can be used.

Other examples of organo-metal compounds include metal acetylacetonates, where the metal can be nickel, boron, phosphorus, vanadium, antimony, yttrium, or combinations thereof. Examples of organo-vanadium compounds include nickel acetylacetonates such as $Ni(AcAc)_3$ (also called nickel (III) 2,4-pentanedionate) where (AcAc) is an acetyl acetonate (also called 2,4-pentanedionate).

In the same way, antimony acetylacetonate, yttrium acetylacetonate, cobaltic acetyl acetonate, cobaltous acetylacetonate, nickel acetylacetonate, zirconium acetylacetonate, dibutyltin acetylacetonate, zinc acetylacetonate and lithium acetylacetonate can be used. For example, antimony 2,4-pentanedionate, yttrium 2,4-pentanedionate, or combinations thereof can be used.

Yet other examples of organo-metal compounds include metal 2-methylhexanoates, metal 2-ethylhexanoates, and metal 2-propylhexanoates. Specific examples include boron 2-methylhexanoate, phosphorus 2-methylhexanoate, silicon 2-methylhexanoate, vanadium 2-methylhexanoate, antimony 2-methylhexanoate, yttrium 2-methylhexanoate, cobalt 2-methylhexanoate, nickel 2-methylhexanoate, zirconium 2-methylhexanoate, tin 2-methylhexanoate, zinc 2-methylhexanoate lithium 2-methylhexanoate, boron 2-ethylhexanoate, phosphorus 2-ethylhexanoate, silicon 2-ethylhexanoate, vanadium 2-ethylhexanoate, antimony 2-ethylhexanoate, yttrium 2-ethylhexanoate, cobalt 2-ethylhexanoate, nickel 2-ethylhexanoate, zirconium 2-ethylhexanoate, tin 2-ethylhexanoate, zinc 2-ethylhexanoate, lithium 2-ethylhexanoate, vanadium 2-propylhexanoate, boron 2-propylhexanoate, phosphorus 2-propylhexanoate, silicon 2-propylhexanoate, antimony 2-propylhexanoate, yttrium 2-propylhexanoate, cobalt 2-propylhexanoate, nickel 2-propylhexanoate, zirconium 2-propylhexanoate, tin 2-propylhexanoate, zinc 2-propylhexanoate and lithium 2-propylhexanoate.

Yet other examples of organo-metal compounds include metal acrylate and metal methacrylate, where the metal can be nickel, boron, phosphorus, vanadium, antimony, yttrium, cobalt, nickel, zirconium, tin, zinc or lithium. Acids including boron can be used also to introduce boron into the intermetallic, for example boric acid, $H_3BO_3$; 2-acetamidopyridine-5-boronic acid, 5-acetyl-2,2-dimethyl-1,3-dioxane-dione; 2-acetylphenylboronic acid; 3-acetylphenylboronic acid; 4-acetylphenylboronic acid; 3-aminocarbonylphenylboronic acid; 4-aminocarbonylphenylboronic acid, 3-amino-4-fluorophenylboronic acid; 4-amino-3-fluorophenylboronic acid, and others commercially available from Boron Molecular, Research Triangle, N.C.

The paste composition, when the nickel intermetallic compound is formed in situ, contains the organometallic compound(s) in a suitable amount. In one embodiment, the paste composition contains the organometallic compounds in an amount of 60-95 wt %, preferably 65-90 wt %, more preferably 70-85 wt %.

The metal additive can be in any suitable form, for example, particles such as spherical, irregular shaped, flaked, agglomerated, or provided in a colloidal suspension, or a particle free solution, and combinations of the foregoing. When the metal additive is in the form of particle, the metal additive particles can have any suitable size. In one embodiment, the metal additive particles have a median particle size of about 0.05 microns or more and about 50 microns or less. In another embodiment, the metal additive particles have a median particle size of about 0.05 microns or more and about 10 microns or less. In yet another embodiment, the metal additive particles have a median particle size of about 0.05 microns or more and about 5 micron or less.

The intermetallic compound particles can have any suitable size. In one embodiment, the intermetallic particles have a $D_{50}$ particle size of about 0.05 to about 10 microns. Preferably, the intermetallic particles have a $D_{50}$ size of 1-8 microns, more preferably 2-5 microns. In another embodiment, the intermetallic particles have a median particle size of about 1 to 9 microns, preferably 2-8 microns more preferably 3-7 microns. Particle size is measured using a Honeywell Microtrac X100 instrument.

Glass Frit.

The glass fits used herein are not critical and the paste composition can contain any suitable glass fits. As an initial matter, the glass fits used in the pastes herein can intentionally contain lead and/or cadmium, or they can be devoid of intentionally added lead and/or cadmium. In one embodiment, the glass frit is a substantially lead-free glass frit. In another embodiment all of the glass fits are lead and cadmium free. The glasses can be partially crystallizing or non-crystallizing. Partially crystallizing glasses are preferred. Mixture of glass frits with one or more crystallizing or partially crystallizing or non-crystallizing structures can be used. The details of the composition and manufacture of the glass frits can be found in, for example, commonly-assigned U.S. Patent Application Publication Nos. 2006/0289055 and 2007/0215202, and Provisional Specification 61/407,588 which are hereby incorporated by reference.

Although generally avoided, substantial additions of thallium oxide or vanadium oxides can be added to these frits to attain lower firing temperatures. Similarly substantial amounts of tellurium oxide or germanium oxide can be added to these fits to attain lower flow temperatures.

The paste composition can include any suitable glass frit. The following tables set forth glass frit compositions useful in the practice of the invention. An entry such as $Sb_2O_5 + V_2O_5$ means that $Sb_2O_5$ or $V_2O_5$ or a combination of the two is present in the specified amount.

TABLE 2

Oxide glass frit composition in weight percent of total glass

| Constituent | Glass Composition I |
|---|---|
| PbO | 52-88 |
| $SiO_2$ | 0.5-15 |
| $Al_2O_3$ | 0.5-10 |
| ZnO | 0-22 |
| $Ta_2O_5$ | 0-8 |
| $ZrO_2$ | 0-10 |
| $P_2O_5$ | 0-8 |
| $Li_2O + K_2O + Na_2O$ | 0-15 |
| $B_2O_3$ | 0-12 |
| $Fe_2O_3 + Co_2O_3 + CuO + MnO_2$ | 0-25 |

TABLE 3

Lead free bismuth glass frit composition in weight percent of total glass.

| Constituent | Glass Composition II |
|---|---|
| $Bi_2O_3$ | 55-90 |
| $B_2O_3$ | 1-15 |
| $SiO_2$ | 0-20 |
| ZnO | 0-13 |
| $K_2O$ | 0-12 |

TABLE 3-continued

Lead free bismuth glass frit composition in weight percent of total glass.

| Constituent | Glass Composition II |
|---|---|
| $LiO_2$ | 0-12 |
| $Na_2O$ | 0-12 |
| $Nb_2O_5 + Ta_2O_5$ | 0-10 |
| $Fe_2O_3 + Co_2O_3 + CuO + MnO_2$ | 0-25 |

TABLE 4

Lead free and bismuth free glass frit composition in weight percent of total glass.

| Constituent | Glass Composition III |
|---|---|
| $B_2O_3 + SiO_2$ | 30-62 |
| ZnO | 0-34 |
| $TiO_2$ | 0-22 |
| $LiO_2$ | 0-10 |
| $Na_2O$ | 0-23 |
| $K_2O$ | 0-13 |
| $P_2O_5$ | 0-10 |
| $Sb_2O_5 + V_2O_5$ | 0-13 |
| $ZrO_2$ | 0-8 |
| F | 0-5 |
| $Fe_2O_3 + Co_2O_3 + CuO + MnO_2$ | 0-25 |

TABLE 5

Lead vanadium phosphorus glass frit composition in weight percent of total glass

| Constituent | Glass Composition | | | |
| | IV | V | VI | VII |
|---|---|---|---|---|
| PbO | 10-60 | | 10-60 | |
| PbO + ZnO + BaO + CaO + SrO | | 5-70 | | 5-70 |
| $V_2O_5$ | 30-70 | 30-70 | | |
| $P_2O_5$ | 5-30 | 5-30 | | |
| $V_2O_5 + P_2O_5 + Ta_2O_5 + Nb_2O_5 + Sb_2O_5$ | | | 5-80 | 5-80 |
| $Fe_2O_3 + Co_2O_3 + CuO + MnO_2$ | 0-25 | | 0-25 | |
| $TeO_2 + GeO_2 + TlO_2$ | | 0-70 | | 0-70 |

Although in these tables the oxides are denoted by the chemical formula of one of their valence states such as $Fe_2O3$, the oxides of other valence states such as FeO or $Fe_3O_4$ are also implied by these formulae.

The frits can contain other oxides such as $MoO_3$, $WO_3$, $In_2O_3$, and/or $Ga_2O_3$ to adjust wetting and flow properties.

The paste composition can contain any suitable amount of the glass frit. In one embodiment, the paste composition includes about 1-15 wt % of the glass frit, preferably 2-12 wt %, more preferably 2-10 wt % more preferably 2-8 wt % and more preferably 3-6 wt %.

Inorganic/Other Additives.

The paste composition can optionally contain any other additives. In one embodiment, phosphorus is added to the paste composition in a variety of ways to reduce the resistance of the front contacts. For example, certain glasses can be modified with $P_2O_5$ in the form of a powdered or fitted oxide, or phosphorus can be added to the paste by way of phosphate esters and other organo-phosphorus compounds. More simply, when the silver and/or metal additives are in the form of particles, phosphorus can be added as a coating to silver and/or metal additive particles prior to making a paste. In such case, prior to pasting, the silver and/or metal additive particles are mixed with liquid phosphorus and a solvent. For example, a blend of about 85 to about 95 wt % silver and/or metal additive particles, about 5 to about 15 wt % solvent, and about 0.1 to about 10 wt % liquid phosphorus is mixed and the solvent evaporated. Phosphorus coated silver and/or metal additive particles help ensure intimate mixing of phosphorus and silver and/or metal additive in the pastes.

Other additives such as fine silicon or carbon powder, or both, can be added to the paste to control the silver reduction and precipitation reaction. The silver precipitation at the interface or in the bulk glass can also be controlled by adjusting the firing atmosphere (e.g., firing in flowing $N_2$ or $N_2/H_2/H_2O$ mixtures). However, no special atmosphere is required. Fine low melting metal additives (e.g., elemental metallic additives as distinct from metal oxides) such as Pb, Bi, In, Ga, Sn, Ni, and Zn or alloys of each with at least one other metal can be added to provide a contact at a lower firing temperature, or to widen the firing window. Typically such metal additions are present at a rate of less than about 1 wt % of the conductive metal portion of the pastes herein. Organometallic compounds providing aluminum, barium, bismuth, magnesium, zinc, strontium, lithium and/or potassium can be used, such as, for example, the acetates, acrylates, methacrylates, formates, neodeconates, methoxides, ethoxides, methoxyethoxides, and stearates of the named metals. Potassium silicate is also a suitable source of potassium.

A mixture of (a) glasses or a mixture of (b) glasses and crystalline additives or a mixture of (c) one or more crystalline additives can be used to formulate a glass component in the desired compositional range. The goal is to reduce the contact resistance and improve the solar cell electrical performance. For example, crystalline materials such as $Bi_2O_3$, $Sb_2O_3$, $Sb_2O_5$, $In_2O_3$, $Ga_2O_3$, SnO, MgO, ZnO, $Cr_2O_3$, $Fe_2O_3$, $Pb_3O_4$, PbO, $SiO_2$, $ZrO_2$, $V_2O_5$, $Al_2O_3$, $B_2O_3$, $TiO_2$, $Nb_2O_5$, $Ta_2O_5$, $Tl_2O$, $TeO_2$ and $GeO_2$ can be added to the glass component to adjust contact properties. The foregoing oxides can be added in glassy (i.e., non-crystalline) form as well. Combinations and reaction products of the aforementioned oxides can also be suitable to design a glass component with desired characteristics. For example, low melting lead silicates, either crystalline or glassy, formed by the reaction of PbO and $SiO_2$ such as $4PbO.SiO_2$, $2PbO.SiO_2$, $3PbO.SiO_2$, $3PbO.2SiO_2$, and $PbO.SiO_2$, either singly or in mixtures can be used to formulate a glass component. Other reaction products of the aforementioned oxides such as, Bismuth silicates such as $Bi_2O_3.SiO_2$, $3Bi_2O_3.5SiO_2$, zinc silicates such as $2ZnO.SiO_2$ and $ZrO_2.SiO_2$ can also be used. Similarly niobates such as bismuth niobates, and titanates such as bismuth titanates can be used. Further mineral forms of these oxides such willemite and zircon can also be added in place of reaction products. However, the total amounts of the above oxides will fall within the ranges specified for various embodiments disclosed elsewhere herein.

It is also envisioned that pigmentary reaction products of these oxides such as cobalt aluminate, cobalt silicates, black pigments such as copper iron manganese oxides can also be used as other crystalline additives.

Exemplary paste compositions include one that includes 65-95 wt % of the nickel intermetallic compound and further comprises 1-10% of an organic vehicle, 1-10 wt % of at least one solvent, and 1-10 wt % of glass. Preferably, the exemplary paste composition comprises 70-90 wt % of the nickel intermetallic compound and further comprises 1-10% of an organic vehicle, 1-10 wt % of at least one solvent, and 1-10 wt % of glass.

Organic Vehicle.

The paste composition can contain any suitable vehicle (e.g., carrier). The organic vehicle or carrier for most conductive compositions is typically a solution of a resin dissolved in a solvent. In one embodiment, the vehicle further contains a thixotropic agent. The solvent usually boils from about 130° C. to about 350° C. In one embodiment, the resin is ethyl cellulose. Other examples of resins include ethyl hydroxyethyl cellulose, wood rosin, gum rosin, mixtures of ethyl cellulose and phenolic resins, polymethacrylates of lower alcohols, and the monobutyl ether of ethylene glycol monoacetate. The pastes of the invention include from about 10-20 wt % of organics, including 3-6 wt % of a vehicle, 2-4 wt % of solvents, and 3-5 wt % of plasticizers.

Examples of solvents include terpenes such as alpha- or beta-terpineol or higher boiling alcohols such as Dowanol® (diethylene glycol monoethyl ether), or mixtures thereof with other solvents such as butyl Carbitol® (diethylene glycol monobutyl ether); dibutyl Carbitol® (diethylene glycol dibutyl ether), butyl Carbitol® acetate (diethylene glycol monobutyl ether acetate), hexylene glycol, Texanol® (2,2, 4-trimethyl-1,3-pentanediol monoisobutyrate), as well as other alcohol esters, kerosene, and dibutyl phthalate.

Plasticizers such as Santicizer® brand from Ferro Corporation are suitable.

In one embodiment, the organic vehicle contains organometallic compounds, for example those based on phosphorus or silver, to modify the contact. Various combinations of these and other solvents can be formulated to obtain the desired viscosity and volatility requirements for each application. Other dispersants, surfactants and rheology modifiers can be included.

Hydrogenated castor oil and derivatives thereof can be used as organic thixotropic agents. A thixotrope is not always necessary because the solvent/resin properties coupled with the shear thinning inherent in any suspension can alone be suitable in this regard. Furthermore, wetting agents can be employed such as fatty acid esters, e.g., N-tallow-1,3-diaminopropane dioleate; N-tallow trimethylene diamine diacetate; N-coco trimethylene diamine, beta diamine; N-oleyl trimethylene diamine; N-tallow trimethylene diamine; and N-tallow trimethylene diamine dioleate, and combinations thereof.

It should be kept in mind that the foregoing compositional ranges are preferred and it is not the intention to be limited to these ranges where one of ordinary skill in the art would recognize, starting with the teachings herein, that these ranges may vary depending upon specific applications, specific components and conditions for processing and forming the end products.

Paste Preparation.

The paste composition can be formed by combining nickel intermetallics, a glass frit, and a metal additive with an organic vehicle and dispersing the nickel intermetallics, the glass frit, and the metal additive in the organic vehicle. Alternately, Ag powder and Ni powder can be used as the metal component of the paste. Stull further, Ag powder may be combined with metal additives including compounds of Nickel with phosphorus or nickel with boron. The amount and type of vehicle utilized can be determined by the final desired formulation viscosity, fineness of grind of the paste, and the desired wet print thickness. In preparing compositions according to the invention, the particulate inorganic solids are mixed with the organic vehicle and dispersed with suitable equipment, such as a three-roll mill, to form a suspension, resulting in a composition for which the viscosity will be in the range of about 50 to about 200 kcps, preferably about 55 to about 120 kcps, at a shear rate of 9.6 sec$^{-1}$ as determined on a Brookfield viscometer HBT, spindle CP-51, measured at 25° C.

Printing and Firing of the Paste.

The aforementioned paste compositions can be used in a process to make a contact (e.g., fired front contact film) or other components, for example, for solar cells. The method of making the contact involves (1) applying the paste composition to a silicon substrate (e.g., silicon wafer), (2) drying the paste, and (3) heating (e.g., firing) the paste to sinter the metal of the paste and make contact to silicon. The printed pattern of the paste is heated or fired at a suitable temperature, such as about 650 to about 1000° C. furnace set temperature, or about 550 to about 850° C. wafer temperature. In one embodiment, the furnace set temperature is about 750 to about 960° C., or 750 to 850° C., and the paste is fired in air. The antireflective SiNx layer is believed to be oxidized and corroded by the glass during firing and Ni/Si islands are formed on reaction with the Si substrate, which are epitaxially bonded to silicon. Firing conditions are chosen to produce a sufficient density of conductive metal/Si islands on the silicon wafer at the silicon/paste interface, leading to a low resistivity contact, thereby producing a high efficiency, high-fill factor solar cell.

A typical ARC is made of a silicon compound such as silicon nitride, generically $SiN_xH$. This layer acts as an insulator, which tends to increase the contact resistance. Corrosion of this ARC layer by the glass component is hence a necessary step in front contact formation. Reducing the resistance between the silicon wafer and the paste can be facilitated by the formation of epitaxial silver/silicon conductive islands at the interface. When such an epitaxial silver/silicon interface does not result, the resistance at that interface becomes unacceptably high. The pastes and processes herein can make it possible to produce an epitaxial silver/silicon interface leading to a contact having low resistance under broad processing conditions—a minimum firing temperature as low as about 650° C., but which can be fired up to about 850° C. (wafer temperature).

Exemplary firing conditions include the following temperature profile in an Infrared Belt (IR) furnace moving at 50-300 inches per minute (ipm), preferably 150-250, for example 200 ipm, in ° C.: 400, 400, 500, 600, 700, 800±50° C.

Method of Making Contact.

A solar cell contact according to the invention can be produced by applying any conductive paste disclosed herein to a substrate, for example, by screen-printing to a desired wet thickness, e.g., from about 10 to about 80 microns. Automatic screen-printing techniques can be employed using a 200-400 mesh screen. The printed pattern is then dried at 250° C. or less, preferably about 80 to about 250° C. for about 0.5-20 minutes before firing. The dry printed pattern can be fired for as little as 1 second up to about 30 seconds at peak temperature, in a belt conveyor furnace in air. During firing, the glass is fused and the metal is sintered.

Referring now to FIGS. 1A-1E, one of many possible exemplary embodiments of making a solar cell front contact is illustrated. The solar cell front contact generally can be produced by applying the paste composition to a solar grade Si wafer. In particular, FIG. 1A schematically shows providing a substrate 10 of single-crystal silicon or multi crystalline silicon. The substrate can have a textured surface which reduces light reflection. In the case of solar cells, substrates are often used as sliced from ingots which have been formed from pulling or casting processes. Substrate surface damage caused by tools such as a wire saw used for slicing and contamination from the wafer slicing step are typically removed by etching away about 10 to 20 microns of the substrate surface using an aqueous alkali solution such as KOH or NaOH, or using a mixture of HF and $HNO_3$. The substrate optionally can be washed with a mixture of HCl and $H_2O_2$ to remove heavy metals such as iron that may adhere to the substrate surface. An antireflective textured surface is sometimes formed thereafter using, for example, an aqueous alkali solution such as aqueous potassium hydroxide or aqueous sodium hydroxide. This resulting substrate is depicted with exaggerated thickness dimensions, as a typical silicon wafer is about 160 to 200 microns thick.

Figure 1B:

FIG. 1B schematically shows that, when a p-type substrate is used, an n-type layer 20 is formed to create a p-n junction. A phosphorus diffusion layer is supplied in any of a variety of suitable forms, including phosphorus oxychloride ($POCl_3$), organophosphorus compounds, and others disclosed herein. The phosphorus source can be selectively applied to only one side of the silicon wafer. The depth of the diffusion layer can be varied by controlling the diffusion temperature and time, is generally about 0.2 to 0.5 microns, and has a sheet resistivity of about 40 to about 120 ohms per square. The phosphorus source can include phosphorus-containing liquid coating material such as phosphosilicate glass (PSG). The phosphorus source can be applied onto only one surface of the substrate by a process such as spin coating, where diffusion is effected by annealing under suitable conditions. According to one embodiment, the n-type layer 20 is formed on the light-receiving surface of the substrate.

Figure 1C:
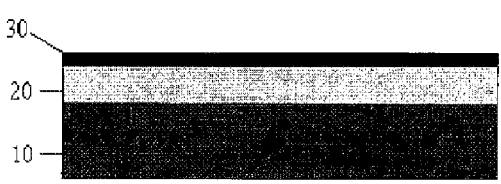

FIG. 1C illustrating forming an antireflective coating (ARC)/passivating film 30 over the substrate 10. The antireflective coating (ARC)/passivating film 30, which can be $SiN_x$, $TiO_2$ or $SiO_2$, may be formed over the above-described n-type diffusion layer 20. The antireflective coating (ARC)/passivating film 30 may also be deposited on both side of the substrate 10. Silicon nitride film is sometimes expressed as $SiN_x$:H to emphasize passivation by hydrogen. The ARC 30 reduces the surface reflectance of the solar cell to incident light, increasing the electrical current generated. The thickness of ARC 30 depends on its refractive index, although a thickness of about 700 to about 900 Å is suitable for a refractive index of about 1.9 to about 2.0. The ARC can be formed by a variety of procedures including low-pressure CVD, plasma CVD, or thermal CVD. When thermal CVD is used to form a $SiN_x$ coating, the starting materials are often dichlorosilane ($SiCl_2H_2$) and ammonia ($NH_3$) gas, and film formation is carried out at a temperature of at least 700° C. When thermal CVD is used, pyrolysis of the starting gases at the high temperature results in the presence of substantially no hydrogen in the silicon nitride film, giving a substantially stoichiometric compositional ratio between the silicon and the nitrogen—$Si_3N_4$. Other methods of forming an ARC can be used.

Figure 1D:
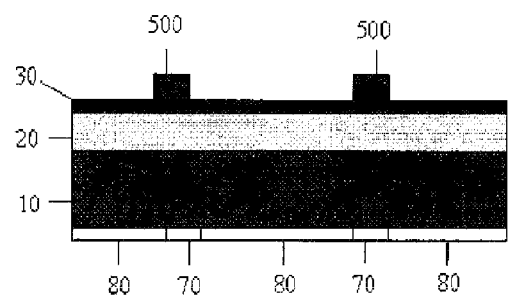

FIG. 1D illustrates applying the subject paste composition 500 over the ARC film 30. The paste composition can be applied by any suitable technique. For example, the paste composition may be applied by screen printing, ink-jet printing, stencil printing, hotmelt ink printing, or microspray onto the front side of the substrate 10. The paste composition may also be applied to the opposite side of the substrate 10. The paste composition 500 is dried at about 125° C. for about 10 minutes. Other drying times and temperatures are possible so long as the paste vehicle is dried of solvent, but not combusted or removed at this stage. In addition to the subject paste composition 500, a high-conductivity layer may further be deposited onto the substrate 10. Specifically, the high-conductivity layer may be deposited on at least a portion of the subject paste composition 500 to form another layer on the contact 10. The high-conductivity layer may comprise a metal selected from the group consisting of silver, silver-coated nickel, and silver-coated copper.

According to another embodiment, an n-type silicon wafer may be used. In this example, a p+ layer may be disposed on a light-receiving surface of the substrate, and an antireflective layer may be deposited on the p+ surface of the substrate.

FIG. 1D further illustrates forming a layer of back side pastes over the back side of the substrate 10. The back side paste layer can contain one or more paste compositions. In one embodiment, the first paste 70 facilitates forming a back side contact and a second paste 80 facilitates forming a p+ layer over the back side of the substrate. The first paste 70 can contain silver or silver/aluminum and the second paste 80 can contain aluminum. An exemplary backside silver/aluminum paste is Ferro 3398, PS 33-610 or PS 33-612, commercially available from Ferro Corporation, Cleveland, Ohio. An exemplary commercially available backside aluminum paste is Ferro AL53-120 Standard, or AL53-112, AL860, AL5116, commercially available from Ferro Corporation, Cleveland, Ohio.

The back side paste layer can be applied to the substrate and dried in the same manner as the front paste layer 500. In this embodiment, the back side is largely covered with the aluminum paste, to a wet thickness of about 30 to 50 microns, owing in part to the need to form a thicker p+ layer in the subsequent process.

The wafer bearing the dried pastes is then fired in an infrared belt furnace, using an air atmosphere, at a furnace set temperature of about 650° C. to about 1000° C. for a period of from about one to several minutes. The firing is generally carried out according to a temperature profile that will allow burnout of the organic matter at about 300° C. to about 550° C., a period of peak furnace set temperature of about 650° C. to about 1000° C., lasting as little as about 1 second, although longer firing times as high as 1, 3, or 5 minutes are possible when firing at lower temperatures.

Firing is typically done in an air atmosphere. For example a six-zone firing profile can be used, with a belt speed of about 1 to about 6.4 meters (40-250 inches) per minute, preferably 5 to 6 meters/minute (about 200 to 240 inches/minute). In a preferred example, zone 1 is about 18 inches (45.7 cm) long, zone 2 is about 18 inches (45.7 cm) long, zone 3 is about 9 inches (22.9 cm) long, zone 4 is about 9 inches (22.9 cm) long, zone 5 is about 9 inches (22.9 cm) long, and zone 6 is about 9 inches (22.9 cm) long. The temperature in each successive zone is typically, though not always, higher than the previous, for example, 350-500° C. in zone 1, 400-550° C. in zone 2, 450-700° C. in zone 3, 600-750° C. in zone 4, 750-900° C. in zone 5, and 800-970° C. in zone 6. Naturally, firing arrangements having more than 3 zones are envisioned by the invention, including 4, 5, 6, 7, 8 or 9 zones or more, each with zone lengths of about 5 to about 20 inches and firing temperatures of 650 to 1000° C.

Figure 1E:
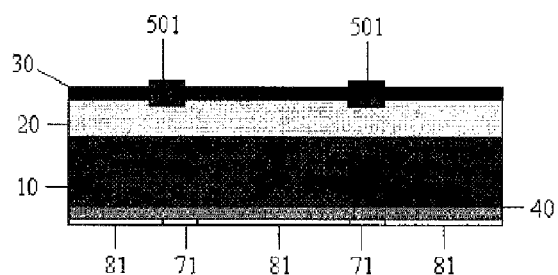

FIG. 1E illustrates sintering the metal portions of the paste 500 and fusing the glass frits of the paste 500, thereby making electrical contacts 501. As schematically shown in FIG. 1E, during firing, the front side paste 500 sinters and penetrates (i.e., fires through) the silicon nitride layer 30 and thereby makes electrical contact 501 with the n-type layer 20. The paste 80 containing aluminum over the back side melts and reacts with the silicon wafer 10, during firing, then solidifies to form a partial p+ layer 40 containing a high concentration of Al dopant. This layer is generally called the back surface field (BSF) layer, and helps to improve the energy conversion efficiency of the solar cell. A back electrode 81 can be formed by firing the paste 80. The paste 70 containing silver or silver/aluminum is fired becoming a back contact. The areas of the back side paste 71 can be used for tab attachment during module fabrication. Processes of making the pastes, solar cell contacts and solar cells disclosed herein are envisioned as embodiments of the invention.

According to another embodiment of the invention, a method of producing a metal-wrap through (MWT) solar cell contact is provided. A p-type silicon wafer having two major surfaces may be provided. An n+ layer may be formed on a light-receiving side of the wafer, and a passivation layer may be applied to at least one of the two major surfaces of the wafer. A plurality of holes may be formed in the wafer, each hole connecting the two major surfaces. A plug paste and back contact paste comprising a nickel intermetallic compound according to the invention may be applied to at least a portion of the plurality of holes, and a back contact and back surface field may then be formed by applying to at least a portion of the second major surface an aluminum paste. A Ni-intermetallic paste may be applied to at least a portion of the front passivation layer, and the wafer may then be fired for a time and temperature sufficient to sinter the metals in the respective pastes and form front and back contacts on the silicon wafer. The firing may be carried out in an air atmosphere at about 650-1000° C. furnace set temperature, preferably about 750-960° C., more preferably about 750-850° C., on an IR belt furnace at 50-300 ipm. The pastes may be applied by known methods, including screen-printing, ink jet printing, stencil printing, hotmelt ink printing, and microspray.

According to another embodiment, the method of producing an MWT solar cell contact may utilize an n-type silicon wafer having two major surfaces. A p+ layer may be formed on a light receiving side of the wafer, and a passivation may be applied to at least one of the two major surfaces of the wafer. A plurality of holes may then be formed in the wafer, each hole connecting the two major surfaces, and an emitter paste comprising a nickel intermetallic compound according to the invention may be applied to at least a portion of the two major surfaces. A back contact and back surface field may be formed by applying to at least a portion of the second major surface an aluminum paste, and the wafer may then be fired for a time and temperature sufficient to sinter the metals in the respective pastes and form front and back contacts on the silicon wafer.

Still another embodiment of the invention is a method of producing an emitter-wrapthrough (EWT) solar cell. First, a p-type silicon wafer may be provided, which forms the first layer of the contact. Next, a plurality of holes may be formed in the wafer according to known methods. A n+-layer may then be disposed onto a light-receiving side of the wafer and along the holes of the wafer, which forms a second layer of the contact. At least a portion of the light-receiving n+-side of the wafer may be texturized. A passivation coating may be deposited on both sides of the wafer, and a plug paste comprising a nickel intermetallic compound may be applied to at least a portion of the plurality of holes. Next, a back contact and back surface field may be formed by applying to at least a portion of the second major surface an aluminum paste separated from the plug paste by a diffusion barrier layer. Lastly, the wafer may be fired for a time and temperature sufficient to sinter the metals in the respective pastes, thus forming front and back contacts on the silicon wafer. According to one embodiment, a high-conductivity paste comprising a metal paste selected from the group consisting of silver, silver-coated nickel, and silver-coated copper may be deposited on at least a portion of the nickel intermetallic compound before forming the back contact and back surface field.

According to another embodiment, a method of making a passivated emitter and rear cell (PERC) is provided. First, a silicon wafer may be provided having an n+-side. At least a portion of the n+-side may be texturized, and a passivation coating may be deposited on both sides of the wafer. Next, a paste comprising a nickel intermetallic compound may be deposited onto at least a portion of the textured side of the wafer. An aluminum paste may be further deposited onto the side opposite the textured side, and the wafer may then be fired to sinter the paste metals, such that the nickel intermetallic compound paste fires through the respective passivation layers to make contact with the silicon wafer. According to another embodiment, a high-conductivity paste comprising a metal paste selected from the group consisting of silver, silver-coated nickel, and silver-coated copper may be deposited onto at least a portion of the nickel intermetallic compound prior to firing. The pastes may be deposited by known methods, including screen-printing, ink-jet printing, stencil printing, hotmelt ink printing, and microspray. According to this embodiment, firing is carried out in an air atmosphere at about 650-1000° C. furnace set temperature, preferably about 750-960° C., more preferably about 750-850° C., on an IR belt furnace at 50-300 ipm.

Experimental Examples

The following examples illustrate the subject invention. Unless otherwise indicated in the following examples and elsewhere in the specification and claims, all parts and percentages are by weight, all temperatures are in degrees Celsius, and pressure is at or near atmospheric pressure.

Polycrystalline silicon wafers, 15.6 cm×15.6 cm, thickness of 150 to 250 microns are coated with a silicon nitride antireflective coating. The sheet resistivity of these wafers is about 55-110 SI/square. EFF means cell efficiency (II); and $R_s$ is previously defined. The paste compositions as indicated in Table 6 are formulated into pastes and the pastes are applied on the silicon wafers, respectively.

TABLE 6

Exemplary paste compositions

| Typical Application Material | Paste A N-Surface Wt % | Paste B Plug (N-MWT) Wt % | Paste C Plug (P-MWT) Wt % |
|---|---|---|---|
| $Ni_3B$ Powder | 82.00 | 82.00 | 82.00 |
| EG 9307 | 2.50 | | |
| EG9395 | 2.50 | | |
| IP550 | | 2.00 | |
| IP775 | | 2.00 | |
| EG9911 | | | 4.00 |
| $Bi_2O_3$ | | 1.00 | 1.00 |
| Zirconia | | 1.00 | 1.00 |
| Santicizer 9100 | 3.56 | | |
| Santicizer 2148 | 0.24 | | |
| Vehicle 196 | 0.47 | | |
| Vehicle 618 | 0.71 | 1.00 | 1.00 |
| Veh EV2770 | 3.16 | 10.00 | 11.00 |
| Dowanol Db | 4.86 | 1.00 | |
| Total | 100.00 | 100.00 | 100.00 |

The "IP" glasses are $PbO$—$Al_2O_3$—$B_2O_3$—$SiO_2$ glasses with oxide ranges of PbO: 30-82 wt %; $SiO_2$: 10-50 wt %;

$B_2O_3$: 0-15 wt %, and $Al_2O_3$: 0-8 wt %. The CTEs of such glasses vary from 37 to $98 \times 10^{-7}/°$ C. and their softening points vary from 425 to 775° C. All glasses in the table above are commercially available.

The exemplary pastes listed in Table 6 have the desired bulk resistivity of less than 2 milli ohms/sq. In addition the Paste A has low contact resistance needed to make good contact with N surface. The pastes B&C have the desired good adhesion to silicon nitride yet providing low leakage current.

The paste compositions are printed using a 280 or 325 mesh screen with about 110 micron openings for front contact finger lines and about 2.5 mm spacing between the lines. Samples are dried at about 250° C. for about 3 minutes after printing the front contacts. The printed wafers are co-fired in air using a 6-zone infrared (IR) belt furnace from Despatch, with a belt speed of about 5 meters (200") per minute, with temperature set points of 880 to 940° C. in the last zone. The zones are 18", 18", 9", 9", 9" and 9" long, respectively. The fired finger width for most samples is about 80 to about 160 microns, and the fired thickness is about 10 to 50 microns.

Electrical performance of the solar cells is measured with a solar tester, Model NCT-M-180A, NPC Incorporated, Dumont, N.J., under AM 1.5 sun conditions, in accordance with ASTM G-173-03.

It will be appreciated that although the examples herein primarily concern a conductive composition for use in forming a conductor paste for in the formation of solar cell contacts, the invention also contemplates the use of the principles disclosed herein to form resistor and semiconductor pastes, inks, tapes and the like. Furthermore, such compositions may or may not be considered as materials for use in forming thick films. Thus, applicants' unique conductive compositions can be utilized to form conductive, resistive or semiconducting paths or patterns on substrates. Such conductive composition can assume various forms including an ink, a paste, a tape and the like. Additionally, substrates other than silicon can be employed in connection with the pastes of the invention. The use of the compositions disclosed herein is also envisioned in a variety of electronic components and devices.

According to a first embodiment item 1, which relates to a solar cell contact comprising a fired combination including, prior to firing: (a.) a crystalline silicon wafer forming a first layer of the contact; (b.) an antireflective layer deposited on the silicon wafer forming a second layer of the contact, and (c.) a paste comprising a nickel intermetallic compound deposited on at least a portion of the antireflective layer forming a third layer of the contact.

Preferred embodiment item 2, which is the solar cell contact of item 1, wherein the paste comprises 65-95 wt % of the nickel intermetallic compound and further comprises 1-10% of an organic vehicle, 1-10 wt % of at least one solvent, and 1-10 wt % of glass.

Preferred embodiment item 3, which is the solar cell contact of item 1, wherein the paste comprises 70-90 wt % of the nickel intermetallic compound and further comprises 1-10% of an organic vehicle, 1-10 wt % of at least one solvent, and 1-10 wt % of glass.

Preferred embodiment item 4, which is the solar cell contact of item 1, further comprising, prior to firing, a high-conductivity layer deposited on at least a portion of the nickel intermetallic compound forming a fourth layer of the contact, the high-conductivity layer comprising a metal paste selected from the group consisting of silver, silver-coated nickel, and silver-coated copper.

Preferred embodiment item 5, which is the solar cell contact of item 1, wherein the nickel intermetallic compound is at least one selected from the group consisting of nickel boride, nickel silicide and nickel phosphide.

Preferred embodiment item 6, which is the solar cell contact of item 3, wherein the nickel intermetallic compound is nickel boride having a particle size of 2 to 5 microns.

Preferred embodiment item 7, which is the solar cell contact of item 2, wherein the nickel intermetallic compound is at least one selected from the group consisting of nickel boride, nickel silicide and nickel phosphide.

Preferred embodiment item 8, which is the solar cell contact of item 1, wherein the paste comprising a nickel intermetallic compound is a hot melt paste.

Preferred embodiment item 9, which is the solar cell contact of item 1, wherein the third layer further comprises a glass.

Preferred embodiment item 10, which is the solar cell contact of item 9, wherein at least the third layer further comprises a glass selected from the group consisting of
  a. a glass comprising 52-88 wt % PbO, 0.5-15 wt % $SiO_2$, 0.5-10 wt % $Al_2O_3$), 0-22 wt % ZnO, 0-8 wt % $Ta_2O_5$, 0-10 wt % $ZrO_2$, 0-8 wt % $P_2O_5$, 0-15 wt % ($Li_2O+Na_2O+K_2O$), 0-12 wt % $B_2O_3$, and 0-25 wt % $Fe_2O_3+Co_2O_3+CuO+MnO_2$,
  b. a glass comprising 55-90 wt % $Bi_2O_3$, 1-15 wt % $B_2O_3$, 0-20 wt % $SiO_2$, 0-13 wt % ZnO, 0-12 wt % $Li_2O$, 0-12 wt % $Na_2O$, 0-12 wt % $K_2O$, 0-10 wt % $Nb_2O_5+Ta_2O_5$, and 0-25 wt % $Fe_2O_3+Co_2O_3+CuO+MnO_2$, and
  c. a glass comprising 30-32 wt % $B_2O_3+SiO_2$, 0-34 wt % ZnO, 0-22 wt % $TiO_2$, 0-10 wt % $Li_2O$, 0-23 wt % $Na_2O$, 0-13 wt % $K_2O$, 0-10 wt % $P_2O_5$, 0-13 wt % $Sb_2O_3+P_2O_5$, 0-8 wt % $ZrO_2$, 0-5 wt % F, and 0-25 wt % $Fe_2O_3+Co_2O_3+CuO+MnO_2$.

Preferred embodiment item 11, which is the solar cell contact of item 1, wherein the high-conductivity layer paste further comprises a glass.

Preferred embodiment item 12, which is the solar cell contact of item II, wherein the high-conductivity layer paste further comprises a glass selected from the group consisting of:
  a. a glass comprising 52-88 wt % PbO, 0.5-15 wt % $SiO_2$, 0.5-10 wt % $Al_2O_3$), 0-22 wt % ZnO, 0-8 wt % $Ta_2O_5$, 0-10 wt % $ZrO_2$, 0-8 wt % $P_2O_5$, 0-15 wt % ($Li_2O+Na_2O+K_2O$), 0-12 wt % $B_2O_3$, and 0-25 wt % $Fe_2O_3+Co_2O_3+CuO+MnO_2$,
  b. a glass comprising 55-90 wt % $Bi_2O_3$, 1-15 wt % $B_2O_3$, 0-20 wt % $SiO_2$, 0-13 wt % ZnO, 0-12 wt % $Li_2O$, 0-12 wt % $Na_2O$, 0-12 wt % $K_2O$, 0-10 wt % $Nb_2O_5+Ta_2O_5$, and 0-25 wt % $Fe_2O_3+Co_2O_3+CuO+MnO_2$, and
  c. a glass comprising 30-32 wt % $B_2O_3+SiO_2$, 0-34 wt % ZnO, 0-22 wt % $TiO_2$, 0-10 wt % $Li_2O$, 0-23 wt % $Na_2O$, 0-13 wt % $K_2O$, 0-10 wt % $P_2O_5$, 0-13 wt % $Sb_2O_3+P_2O_5$, 0-8 wt % $ZrO_2$, 0-5 wt % F, and 0-25 wt % $Fe_2O_3+Co_2O_3+CuO+MnO_2$.

Preferred embodiment item 13, which is the solar cell contact of item 1, wherein the paste comprises 78.82 wt % of the nickel intermetallic compound and further comprises 3-6 wt % of an organic vehicle, 2-4 wt % of at least one solvent, and 2-6 wt % of glass.

According to a second embodiment item 14, which relates to a solar cell contact comprising a fired combination including, prior to firing:
  a. a p-type silicon wafer forming a first layer of the contact, the silicon wafer having an n+ layer disposed on a light-receiving side of the wafer;

b. an antireflective layer on the n+ side of the silicon wafer forming a second layer of the contact, and
c. a paste comprising a nickel intermetallic compound disposed on the silicon wafer, forming a third layer of the contact.

Preferred embodiment item 15, which is the solar cell contact of item 14, wherein the nickel intermetallic compound is at least one selected from the group consisting of nickel boride, nickel silicide and nickel phosphide.

According to a third embodiment item 16, which relates to a solar cell contact comprising a fired combination including, prior to firing:
a. a n-type silicon wafer forming a first layer of the contact, the silicon wafer having a p+ layer disposed on a light-receiving side of the wafer;
b. an antireflective layer on the p+ side of the silicon wafer fanning a second layer of the contact, and
c. a paste comprising a nickel intermetallic compound disposed on the silicon wafer, forming a third layer of the contact.

Preferred embodiment item 17, which is the solar cell contact of item 16, wherein the nickel intermetallic compound is at least one selected from the group consisting of nickel boride, nickel silicide and nickel phosphide.

According to a fourth embodiment item 18, which relates to a method of making a solar cell having an N-type wafer comprising:
a. providing a silicon wafer having an n+-side and a p+-side,
b. texturing at least a portion of the p+-side of the wafer to form a textured side,
c. depositing a passivation coating on both sides of the wafer,
d. depositing a paste including a nickel intermetallic compound onto the side opposite the textured side (n+-side),
e. depositing a paste comprising a nickel intermetallic compound on at least a portion of the textured side of the wafer, and
f. firing the wafer to sinter the paste metals such that the nickel intermetallic paste fires through the respective passivation layers to make contact to silicon.

Preferred embodiment item 19, which is the method of item 18, wherein after (f) and prior to (g), the method further comprises (f1), depositing an high-conductivity paste on at least a portion of the nickel intermetallic compound, the high-conductivity paste comprising a metal paste selected from the group consisting of silver, silver-coated nickel, and silver-coated copper.

Preferred embodiment item 20, which is the method of item 18, wherein depositing in at least one of (c), (d), and (f) is carried out by at least one procedure selected from the group consisting of screen-printing and ink-jet printing, stencil printing, hotmelt ink printing, and microspray.

Preferred embodiment item 21, which is the method of item 18, wherein the nickel intermetallic compound is at least one selected from the group consisting of nickel boride, nickel silicide and nickel phosphide.

Preferred embodiment item 22, which is the method of item 21, wherein the least one selected from the group consisting of nickel boride, nickel silicide and nickel phosphide, are formed in situ by deposition of an organonickel compound and at least one of an organoboron compound, an organosilicon compound and an organophosphorus compound.

Preferred embodiment item 23, which is the method of item 18, wherein the nickel intermetallic compound is nickel boride, which is formed in situ by the deposition of an organonickel compound and an organoboron compound.

Preferred embodiment item 24, which is the method of item 18, wherein the nickel intermetallic compound is nickel boride having a particle size of 2 to 5 microns.

Preferred embodiment item 25, which is the method of item 18, wherein at least one of the p+-paste and the paste comprising the nickel intermetallic compound is a hot melt paste.

Preferred embodiment item 26, which is the method of item 18, wherein at least one of the p+-paste and the paste comprising the nickel intermetallic compound further comprises a glass.

Preferred embodiment item 27, which is the method of item 18, wherein the paste comprising the nickel intermetallic compound comprises 78-82 wt % of the nickel intermetallic compound and further comprises 3-6 wt % of an organic vehicle, 2-4 wt % of at least one solvent, and 2-6 wt % of glass.

Preferred embodiment item 28, which is the method of item 26, wherein the glass is selected from the group consisting of:
a. a glass comprising 52-88 wt % PbO, 0.5-15 wt % $SiO_2$, 0.5-10 wt % $Al_2O_3$), 0-22 wt % ZnO, 0-8 wt % $Ta_2O_5$, 0-10 wt % $ZrO_2$, 0-8 wt % $P_2O_5$, 0-15 wt % ($Li_2O$+$Na_2O$+$K_2O$), 0-12 wt % $B_2O_3$, and 0-25 wt % $Fe_2O_3$+$Co_2O_3$+CuO+$MnO_2$,
b. a glass comprising 55-90 wt % $Bi_2O_3$, 1-15 wt % $B_2O_3$, 0-20 wt % $SiO_2$, 0-13 wt % ZnO, 0-12 wt % $Li_2O$, 0-12 wt % $Na_2O$, 0-12 wt % $K_2O$, 0-10 wt % $Nb_2O_5$+$Ta_2O_5$, and 0-25 wt % $Fe_2O_3$+$Co_2O_3$+CuO+$MnO_2$, and
c. a glass comprising 30-32 wt % $B_2O_3$+$SiO_2$, 0-34 wt % ZnO, 0-22 wt % $TiO_2$, 0-10 wt % $Li_2O$, 0-23 wt % $Na_2O$, 0-13 wt % $K_2O$, 0-10 wt % $P_2O_5$, 0-13 wt % $Sb_2O_3$+$P_2O_5$, 0-8 wt % $ZrO_2$, 0-5 wt % F, and 0-25 wt % $Fe_2O_3$+$Co_2O_3$+CuO+$MnO_2$.

Preferred embodiment item 29, which is the method of item 18, wherein the firing is carried out in an air atmosphere.

Preferred embodiment item 30, which is the method of item 18, wherein the firing is carried out at 750-850° C. on an IR belt furnace at 50-300 ipm.

According to a fifth embodiment item 31, which relates to a method of producing a metal-wrap through solar cell contact comprising:
a. providing a p-type silicon wafer having two major surfaces,
b. forming a n+ layer on a light-receiving side of the wafer,
c. applying to at least one of the two major surfaces a passivation layer,
d. forming a plurality of holes in the wafer, each hole connecting the two major surfaces,
e. applying a plug paste and back contact paste comprising a nickel intermetallic compound to at least a portion of the plurality of holes,
f. forming a back contact and back surface field by applying to at least a portion of the second major surface an aluminum paste,
g. applying to at least a portion of the front passivation layer a Ni intermetallic paste, and
h. firing the wafer for a time and temperature sufficient to sinter the metals in the respective pastes and form front and back contacts to silicon.

Preferred embodiment item 32, which is the method of item 31, wherein firing is carried out at about 650 to about 1000° C. furnace set temperature.

Preferred embodiment item 33, which is the method of item 31, wherein firing is carried out at about 750 to about 960° C. furnace set temperature.

Preferred embodiment item 34, which is the method of item 31, wherein firing is carried out at about 750 to about 850° C. furnace set temperature.

Preferred embodiment item 35, which is the method of item 31, wherein the firing is carried out in an air atmosphere.

Preferred embodiment item 36, which is the method of item 31, wherein the firing is carried out on an IR belt furnace at 50-300 ipm.

Preferred embodiment item 37, which is the method of item 31, wherein depositing in at least one of (c), (d), and (e) is carried out by at least one selected from the group consisting of screen-printing and ink-jet printing, stencil printing, hotmelt ink printing, and microspray.

According to a sixth embodiment item 38, which relates to a method of producing an emitter wrap through (EWT) solar cell comprising:
 a. providing a p-type silicon wafer forming a first layer of the contact,
 b. forming a plurality of holes in the wafer,
 c. forming an n+-layer disposed onto a light-receiving side and along the holes of the wafer forming a second layer of the contact, texturing at least a portion of the light receiving n+-side of the wafer to form a textured side,
 d. depositing a passivation coating on both sides of the wafer, applying a plug paste comprising a nickel intermetallic compound to at least a portion of the plurality of holes,
 e. forming a back contact and back surface field by applying to at least a portion of the second major surface an aluminum paste separated from the plug paste by a diffusion barrier layer,
 f. firing the wafer for a time and temperature sufficient to sinter the metals in the respective pastes and form front and back contacts to silicon.

Preferred embodiment item 39, which is the method of item 38, wherein after (d) and prior to (e), the method further comprises (d1), depositing an high-conductivity paste on at least a portion of the nickel intermetallic compound, the high-conductivity paste comprising a metal paste selected from the group consisting of silver, silver-coated nickel, and silver-coated copper.

Preferred embodiment item 40, which is the method of item 38, wherein the nickel intermetallic compound is at least one selected from the group consisting of nickel boride, nickel silicide and nickel phosphide.

Preferred embodiment item 41, which is the method of item 38, wherein the nickel intermetallic compound is nickel boride having a particle size of 2 to 5 microns.

Preferred embodiment item 42, which is the method of item 38, wherein at least one of the emitter paste and the aluminum paste comprising the nickel intermetallic compound is a hot melt paste.

Preferred embodiment item 43, which is the method of item 38, wherein at least one of the emitter paste and the aluminum paste further comprises a glass.

Preferred embodiment item 44, which is the method of item 38, wherein the paste comprising the nickel intermetallic compound comprises 78-82 wt % of the nickel intermetallic compound and further comprises 3-6 wt % of an organic vehicle, 2-4 wt % of at least one solvent, and 2-6 wt % of glass.

Preferred embodiment item 45, which is the method of item 38, wherein at least one of the emitter paste and the aluminum paste further comprises a glass.

Preferred embodiment item 46, which is the method of item 45, wherein the glass is selected from the group consisting of:
 a. a glass comprising 52-88 wt % PbO, 0.5-15 wt % $SiO_2$, 0.5-10 wt % $Al_2O_3$), 0-22 wt % ZnO, 0-8 wt % $Ta_2O_5$, 0-10 wt % $ZrO_2$, 0-8 wt % $P_2O_5$, 0-15 wt % ($Li_2O$+$Na_2O$+$K_2O$), 0-12 wt % $B_2O_3$, and 0-25 wt % $Fe_2O_3$+$Co_2O_3$+CuO+$MnO_2$,
 b. a glass comprising 55-90 wt % $Bi_2O_3$, 1-15 wt % $B_2O_3$, 0-20 wt % $SiO_2$, 0-13 wt % ZnO, 0-12 wt % $Li_2O$, 0-12 wt % $Na_2O$, 0-12 wt % $K_2O$, 0-10 wt % $Nb_2O_5$+$Ta_2O_5$, and 0-25 wt % $Fe_2O_3$+$Co_2O_3$+CuO+$MnO_2$, and
 c. a glass comprising 30-32 wt % $B_2O_3$+$SiO_2$, 0-34 wt % ZnO, 0-22 wt % $TiO_2$, 0-10 wt % $Li_2O$, 0-23 wt % $Na_2O$, 0-13 wt % $K_2O$, 0-10 wt % $P_2O_5$, 0-13 wt % $Sb_2O_3$+$P_2O_5$, 0-8 wt % $ZrO_2$, 0-5 wt % F, and 0-25 wt % $Fe_2O_3$+$Co_2O_3$+CuO+$MnO_2$.

According to a seventh embodiment item 47, which relates to a method of making a passivated emitter and rear cell (PERC) comprising:
 a. providing a silicon wafer having an n+-side,
 b. texturing at least a portion of the n+-side of the wafer to form a textured side,
 c. depositing a passivation coating on both sides of the wafer,
 d. depositing a paste comprising a nickel intermetallic compound on at least a portion of the textured side of the wafer,
 e. depositing an aluminum paste onto the side opposite the textured side, and
 f. firing the wafer to sinter the paste metals such that the nickel intermetallic compound paste fires through the respective passivation layers to make contact to silicon.

Preferred embodiment item 48, which is the method of item 47, wherein after (t) and prior to (g), the method further comprises (f1), depositing an high-conductivity paste on at least a portion of the nickel intermetallic compound, the high-conductivity paste comprising a metal paste selected from the group consisting of silver, silver-coated nickel, and silver-coated copper.

Preferred embodiment item 49, which is the method of item 47, wherein depositing in at least one of (c), (d), and (f) is carried out by at least one selected from the group consisting of screen-printing and ink-jet printing, stencil printing, hotmelt ink printing, and microspray.

Preferred embodiment item 50, which is the method of item 47, wherein the nickel intermetallic compound is at least one selected from the group consisting of nickel boride, nickel silicide and nickel phosphide.

Preferred embodiment item 51, which is the method of item 47, wherein the nickel intermetallic compound is at least one selected from the group consisting of nickel boride, nickel silicide and nickel phosphide, which are formed in situ by deposition of an organonickel compound and at least one of an organoboron compound, an organosilicon compound and an organophosphorus compound.

Preferred embodiment item 52, which is the method of item 47, wherein the nickel intermetallic compound is nickel boride, which is formed in situ by the deposition of an organonickel compound and an organoboron compound.

Preferred embodiment item 53, which is the method of item 47, wherein the nickel intermetallic compound is nickel boride having a particle size of 2 to 5 microns.

Preferred embodiment item 54, which is the method of item 47, wherein at least one of the p+-paste and the paste comprising the nickel intermetallic compound further comprises a glass.

Preferred embodiment item 55, which is the method of item 47, wherein the glass is selected from the group consisting of:
   a. a glass comprising 52-88 wt % PbO, 0.5-15 wt % $SiO_2$, 0.5-10 wt % $Al_2O_3$), 0-22 wt % ZnO, 0-8 wt % $Ta_2O_5$, 0-10 wt % $ZrO_2$, 0-8 wt % $P_2O_5$, 0-15 wt % ($Li_2O$+$Na_2O$+$K_2O$), 0-12 wt % $B_2O_3$, and 0-25 wt % $Fe_2O_3$+$Co_2O_3$+CuO+$MnO_2$,
   b. a glass comprising 55-90 wt % $Bi_2O_3$, 1-15 wt % $B_2O_3$, 0-20 wt % $SiO_2$, 0-13 wt % ZnO, 0-12 wt % $Li_2O$, 0-12 wt % $Na_2O$, 0-12 wt % $K_2O$, 0-10 wt % $Nb_2O_5$+$Ta_2O_5$, and 0-25 wt % $Fe_2O_3$+$Co_2O_3$+CuO+$MnO_2$, and
   c. a glass comprising 30-32 wt % $B_2O_3$+$SiO_2$, 0-34 wt % ZnO, 0-22 wt % $TiO_2$, 0-10 wt % $Li_2O$, 0-23 wt % $Na_2O$, 0-13 wt % $K_2O$, 0-10 wt % $P_2O_5$, 0-13 wt % $Sb_2O_3$+$P_2O_5$, 0-8 wt % $ZrO_2$, 0-5 wt % F, and 0-25 wt % $Fe_2O_3$+$Co_2O_3$+CuO+$MnO_2$.

Preferred embodiment item 56, which is the method of item 47, wherein firing is carried out at about 650 to about 1000° C. furnace set temperature.

Preferred embodiment item 57, which is the method of item 47, wherein firing is carried out at about 750 to about 960° C. furnace set temperature.

Preferred embodiment item 58, which is the method of item 47, wherein firing is carried out at about 750 to about 850° C. furnace set temperature.

Preferred embodiment item 59, which is the method of item 47, wherein the firing is carried out in an air atmosphere.

Preferred embodiment item 60, which is the method of item 47, wherein the firing is carried out on an IR belt furnace at 50-300 ipm.

According to a seventh embodiment item 61, which relates to a method of producing a metal-wrap through solar cell contact comprising:
   a. providing a n-type silicon wafer having two major surfaces,
   b. forming a p+ layer on a light receiving side of the wafer,
   c. applying to at least one of the two major surfaces of the wafer a passivation layer,
   d. forming a plurality of holes in the wafer, each hole connecting the two major surfaces,
   e. applying an emitter paste comprising a nickel intermetallic compound to at least a portion of the two major surfaces,
   f. forming a back contact and back surface field by applying to at least a portion of the second major surface an aluminum paste, and
   g. firing the wafer for a time and temperature sufficient to sinter the metals in the respective pastes and form front and back contacts to silicon.

What has been described above includes examples of the subject invention. It is, of course, not possible to describe every conceivable combination of components or methodologies for purposes of describing the subject invention, but one of ordinary skill in the art may recognize that many further combinations and permutations of the subject invention are possible. Accordingly, the subject invention is intended to embrace all such alterations, modifications and variations that fall within the spirit and scope of the appended claims. Furthermore, to the extent that the terms "contain," "have," "include," and "involve" are used in either the detailed description or the claims, such terms are intended to be inclusive in a manner similar to the term "comprising" as "comprising" is interpreted when employed as a transitional word in a claim. In some instances, however, to the extent that the terms "contain,' "have," "include," and "involve" are used in either the detailed description or the claims, such terms are intended to be partially or entirely exclusive in a manner similar to the terms "consisting of" or "consisting essentially of" as "consisting of" or "consisting essentially of" are interpreted when employed as a transitional word in a claim.

The invention claimed is:

1. A solar cell contact comprising:
   a. a crystalline silicon wafer forming a first layer of the contact;
   b. an antireflective layer deposited on the silicon wafer forming a second layer of the contact,
   c. a third layer of the contact comprising at least one of nickel boride and nickel phosphide deposited on at least a portion of the antireflective layer, and
   d. a high-conductivity layer deposited on at least a portion of the third layer thereby forming a fourth layer of the contact, the high-conductivity layer comprising a metal selected from the group consisting of silver, silver-coated nickel, and silver-coated copper.

2. The solar cell contact of claim 1, wherein the third layer further comprises a glass.

3. The solar cell contact of claim 1, wherein the high-conductivity layer further comprises a glass.

4. The solar cell contact of claim 3, wherein the high-conductivity layer comprises a glass selected from the group consisting of:
   a. a glass comprising 52-88 wt % PbO, 0.5-15 wt % $SiO_2$, 0.5-10 wt % $Al_2O_3$, 0-22 wt % ZnO, 0-8 wt % $Ta_2O_5$, 0-10 wt % $ZrO_2$, 0-8 wt % $P_2O_5$, 0-15 wt % ($Li_2O$+$Na_2O$+$K_2O$), 0-12 wt % $B_2O_3$, and 0-25 wt % $Fe_2O_3$+$CO_2O_3$+CuO+$MnO_2$, based upon total weight of the glass,
   b. a glass comprising 55-90 wt % $Bi_2O_3$, 1-15 wt % $B_2O_3$, 0-20 wt % $SiO_2$, 0-13 wt % ZnO, 0-12 wt % $Li_2O$, 0-12 wt % $Na_2O$, 0-12 wt % $K_2O$, 0-10 wt % $Nb_2O_5$+$Ta_2O_5$, and 0-25 wt % $Fe_2O_3$+$Co_2O_3$+CuO+$MnO_2$, based upon total weight of the glass, and
   c. a glass comprising 30-62 wt % $B_2O_3$+$SiO_2$, 0-34 wt % ZnO, 0-22 wt % $TiO_2$, 0-10 wt % $Li_2O$, 0-23 wt % $Na_2O$, 0-13 wt % $K_2O$, 0-10 wt % $P_2O_5$, 0-13 wt % $Sb_2O_3$+$P_2O_5$, 0-8 wt % $ZrO_2$, 0-5 wt % F, and 0-25 wt % $Fe_2O_3$+$Co_2O_3$+CuO+$MnO_2$, based upon total weight of the glass.

5. A solar cell contact comprising:
   a. a crystalline silicon wafer forming a first layer;
   b. an antireflective layer deposited on the silicon wafer forming a second layer, and
   c. a third layer deposited on at least a portion of the antireflective layer, the third layer formed from a paste comprising: (i) 65-95 wt % of a nickel intermetallic compound selected from at least one of nickel boride and nickel phosphide, (ii) 1-10 wt % of an organic vehicle, 1-10 wt % of at least one solvent, and 1-10 wt % of glass.

6. The solar cell contact of claim 5, wherein the paste comprises 70-90 wt % of the nickel intermetallic compound.

7. The solar cell contact of claim 5, wherein the nickel intermetallic compound is nickel boride having a particle size of 2 to 5 microns.

8. The solar cell contact of claim 5, wherein the paste comprising a nickel intermetallic compound is a hot melt paste.

9. The solar cell contact of claim 5, wherein the glass is selected from the group consisting of:
   a. a glass comprising 52-88 wt % PbO, 0.5-15 wt % $SiO_2$, 0.5-10 wt % $Al_2O_3$, 0-22 wt % ZnO, 0-8 wt % $Ta_2O_5$, 0-10 wt % $ZrO_2$, 0-8 wt % $P_2O_5$, 0-15 wt % ($Li_2O$+$Na_2O$+$K_2O$), 0-12 wt % $B_2O_3$, and 0-25 wt % $Fe_2O_3$+$CO_2O_3$+CuO+$MnO_2$, based upon total weight of the glass,
   b. a glass comprising 55-90 wt % $Bi_2O_3$, 1-15 wt % $B_2O_3$, 0-20 wt % $SiO_2$, 0-13 wt % ZnO, 0-12 wt % $Li_2O$, 0-12 wt % $Na_2O$, 0-12 wt % $K_2O$, 0-10 wt % $Nb_2O_5$+$Ta_2O_5$, and 0-25 wt % $Fe_2O_3$+$Co_2O_3$+CuO+$MnO_2$, based upon total weight of the glass, and
   c. a glass comprising 30-62 wt % $B_2O_3$+$SiO_2$, 0-34 wt % ZnO, 0-22 wt % $TiO_2$, 0-10 wt % $Li_2O$, 0-23 wt % $Na_2O$, 0-13 wt % $K_2O$, 0-10 wt % $P_2O_5$, 0-13 wt % $Sb_2O_3$+$P_2O_5$, 0-8 wt % $ZrO_2$, 0-5 wt % F, and 0-25 wt % $Fe_2O_3$+$Co_2O_3$+CuO+$MnO_2$, based upon total weight of the glass.

10. The solar cell contact of claim 5, wherein the paste comprises 78-82 wt % of the nickel intermetallic compound, 3-6 wt % of the organic vehicle, 2-4 wt % of the at least one solvent, and 2-6 wt % of the glass.

11. The solar cell contact of claim 5, wherein the paste further includes a crystalline additive comprising $Bi_2O_3$, $ZrO_2$, or a combination thereof.

* * * * *